(12) United States Patent  
Lin

(10) Patent No.: US 9,892,985 B2  
(45) Date of Patent: Feb. 13, 2018

(54) SEMICONDUCTOR DEVICE AND METHOD FOR MANUFACTURING THE SAME

(71) Applicant: NANYA TECHNOLOGY CORPORATION, Taoyuan (TW)

(72) Inventor: Po Chun Lin, Changhua (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 15/212,718

(22) Filed: Jul. 18, 2016

(65) Prior Publication Data

US 2018/0019174 A1 Jan. 18, 2018

(51) Int. Cl.
| | |
|---|---|
| *H01L 23/00* | (2006.01) |
| *H01L 23/48* | (2006.01) |
| *H01L 23/528* | (2006.01) |
| *H01L 23/532* | (2006.01) |
| *H01L 23/14* | (2006.01) |
| *H01L 23/498* | (2006.01) |

(52) U.S. Cl.
CPC ...... *H01L 23/147* (2013.01); *H01L 23/49811* (2013.01); *H01L 24/11* (2013.01); *H01L 24/13* (2013.01); *H01L 24/32* (2013.01); *H01L 24/83* (2013.01); *H01L 2224/13013* (2013.01)

(58) Field of Classification Search
CPC ..... H01L 24/32; H01L 24/83; H01L 23/3107; H01L 24/13; H01L 23/49811; H01L 24/81; H01L 2924/014; H01L 2224/16238; H01L 2224/13; H01L 23/147; H01L 2224/13022; H01L 23/49833

See application file for complete search history.

(56) References Cited

U.S. PATENT DOCUMENTS

| | | | |
|---|---|---|---|
| 5,258,648 A | 11/1993 | Lin | |
| 5,611,884 A * | 3/1997 | Bearinger | ............. C09J 183/04 156/325 |
| 6,392,296 B1 | 5/2002 | Ahn et al. | |
| 2011/0304999 A1 | 12/2011 | Yu et al. | |
| 2013/0082365 A1 | 4/2013 | Bernier et al. | |
| 2014/0036454 A1 | 2/2014 | Caskey et al. | |
| 2015/0155255 A1* | 6/2015 | Aoki | ................... H01L 25/0657 257/737 |

* cited by examiner

*Primary Examiner* — Jasmine Clark

(74) *Attorney, Agent, or Firm* — Muncy, Geissler, Olds & Lowe, P.C.

(57) ABSTRACT

One aspect of the present disclosure provides a semiconductor device. In some embodiments, the semiconductor device includes an integrated circuit die, at least one conductive terminal disposed on the integrated circuit die, a frame positioned on the integrated circuit die, wherein the frame substantially exposes the at least one conductive terminal, and at least one conductive bump positioned in the frame, wherein the at least one conductive bump electrically connects the at least one conductive terminal.

17 Claims, 16 Drawing Sheets

SEMICONDUCTOR DEVICE AND METHOD FOR MANUFACTURING THE SAME

TECHNICAL FIELD

The present disclosure relates to a semiconductor device having conductive bumps and a method for manufacturing same, which has an extremely fine-pitch, high thermal dissipation property, low warpage, and minimized bumping stress.

DISCUSSION OF THE BACKGROUND

Packaging technology for integrated circuit (IC) structures has been continuously developed to meet the demand toward miniaturization and mounting reliability. Recently, as the miniaturization and high functionality of electric and electronic products are required, various techniques have been disclosed in the art.

As is known, semiconductor chips generate heat while operating. Different thermal expansion coefficients between silicon and metal or metallic substances can cause stress in a semiconductor chip as its temperature rises and falls during operation, which is a phenomenon that can significantly deteriorate the integrity and reliability of silicon/metal junctions in a chip during the operation of the semiconductor chip. Displacements of respective materials vary when operation temperature is changed, and if the stress caused by the difference in thermal expansion coefficient cannot be relieved, a fracture of the package may result.

Furthermore, the heat from operating chips usually causes dysfunctions of the integrated circuit structure. When the temperature of the chip increases, it may affect relatively small cross-section wires and thus disrupt the normal behavior of an integrated circuit structure. Consequently, the problem of heat dissipation in integrated circuit structures has attracted increasing interest in recent years due to the miniaturization of semiconductor packages.

Generally speaking, there are two different signal joint bonding methods used in the assembly industry, which are conventional wire bonding (WB) and advanced flip chip bonding (FCB). Such bonding methods used for forming an IC package before mounting onto an application printed circuit board (PCB) or another logical package.

Wire bonding technology is still the most widely used for signal joints in the IC assembly industry because of low cost and changeable process, as long as a semiconductor device design had considered the wire looping. When facing overhang issue of the wire bonding, the SiP (system in package) module adopts the wire bonding together with silicon spacers.

In addition, there are various FCB architectures depending on joint size/pitch/height and field of applications. Regardless of the FCB type, the major benefits of applying an FCB process are higher thermal/electrical performance and smaller package form factor as compared to wire bonding packages. In particular, most of the logical dice are applied with an FCB process due to very high input/output (I/O) numbers.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides a semiconductor device having conductive bumps and a method for manufacturing the same, which has an extremely fine-pitch, high thermal dissipation property, low warpage, and minimized bumping stress.

One aspect of the present disclosure provides a semiconductor device. In some embodiments, the semiconductor device comprises an integrated circuit die; at least one conductive terminal disposed on the integrated circuit die; a frame positioned on the integrated circuit die, wherein the frame substantially exposes the at least one conductive terminal; and at least one conductive bump positioned in the frame, wherein the at least one conductive bump electrically connects the at least one conductive terminal.

Another aspect of the present disclosure provides a semiconductor package. In some embodiments, the semiconductor package comprises a semiconductor device having at least one conductive terminal; a frame positioned on the semiconductor device, wherein the frame substantially exposes the at least one conductive terminal; at least one conductive bump positioned in the frame, wherein the at least one conductive bump electrically connects the at least one conductive terminal; an object having at least one conductive pad; and an adhesive layer interposed between the semiconductor device and the object.

In some embodiments, the frame is a supporting layer of non-conductive material selected from the group consisting of silicon and silicon oxide.

In some embodiments, the frame comprises a supporting layer of non-conductive material selected from the group consisting of silicon and silicon oxide and an interposing layer between the supporting layer and the integrated circuit die.

In some embodiments, the semiconductor device further comprises at least one conductive joint disposed between the at least one conductive bump and the at least one conductive terminal.

In some embodiments, the at least one conductive joint and the at least one conductive bump are made of different materials.

In some embodiments, the at least one conductive bump has a substantially non-spherical sidewall in a cross-sectional view.

In some embodiments, the at least one conductive bump has a substantially vertical sidewall in a cross-sectional view.

Another aspect of the present disclosure provides a method for manufacturing a semiconductor package. In some embodiments, the method for manufacturing a semiconductor package comprises the steps of preparing a semiconductor device having at least one conductive terminal; forming a frame on the semiconductor device, wherein the frame substantially exposes the at least one conductive terminal; and forming at least one conductive bump in the frame, wherein the at least one conductive bump electrically connects the at least one conductive terminal.

Another aspect of the present disclosure provides a method for manufacturing a semiconductor package. In some embodiments, the method for manufacturing a semiconductor package comprises the steps of preparing a semiconductor device having at least one conductive terminal;

forming a frame having at least one hole and conductive joint on the semiconductor device, wherein the at least one hole and conductive joint are positioned above the at least one conductive terminal; and forming at least one conductive bump in the at least one hole of the frame, wherein the at least one conductive bump electrically connects the at least one conductive terminal.

In some embodiments, the step of forming a frame on the semiconductor device comprises: forming a supporting layer of non-conductive material selected from the group consisting of silicon and silicon oxide on the semiconductor device; forming an etching mask layer having at least one opening on the supporting layer, wherein the at least one opening is positioned above the at least one conductive terminal; and performing an etching process to form at least one hole in the supporting layer by using the etching mask layer, wherein the at least one hole exposes the at least one conductive terminal.

In some embodiments, the step of forming a frame on the semiconductor device comprises: forming an interposing layer on the semiconductor device; forming a supporting layer of non-conductive material selected from the group consisting of silicon and silicon oxide on the interposing layer; forming an etching mask layer having at least one opening on the supporting layer, wherein the at least one opening is positioned above the at least one conductive terminal; and performing an etching process to form at least one hole in the supporting layer by using the etching mask layer, wherein the at least one hole exposes the at least one conductive terminal.

In some embodiments, the step of forming at least one conductive bump in the frame comprises performing a plating process.

In some embodiments, the method further comprises the steps of: preparing an object having at least one conductive pad; and attaching the semiconductor device to the object with an adhesive layer interposed between the semiconductor device and the object, wherein the at least one conductive pad electrically connects the at least one conductive bump.

In some embodiments of the present disclosure, the frame defines the boundary of the conductive bump, i.e., the present disclosure forms the frame before the bump. In some embodiments, the at least one hole in the frame for the conductive bump is formed by the lithographic process and the etching process, which can form at least one hole (the conductive bump) in an extremely fine-pitch, and the conductive bump can be formed with a very fine size. Consequently, the present disclosure is capable of implementing a semiconductive device having high input/output density.

In some embodiments of the present disclosure, the conductive bump is surrounded by the frame of silicon or silicon oxide; in contrast; the conventional bump is surrounded by resin. Because the thermal conductivity of the frame of silicon or silicon oxide is higher than that of resin, the frame has a high thermal dissipation property. In addition, both the strength and stiffness of the frame of silicon or silicon oxide is higher than that of resin, the semiconductor device with the frame as a whole has a high stress (resulting in the conductive bump suffering from a lower thermal stress) and the warpage of the semiconductor device can be reduced.

In the prior art, the molding compound and the adhesive layer form an interface at the circuit part of the semiconductor device, and the die crack may occur at the circuit part of the semiconductor device. In contrast, the molding compound and the adhesive layer form an interface at the frame without a circuit, which can prevent die crack from occurring in the semiconductor device.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a semiconductor package having conductive bumps in a limited geometry and a method for manufacturing same. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
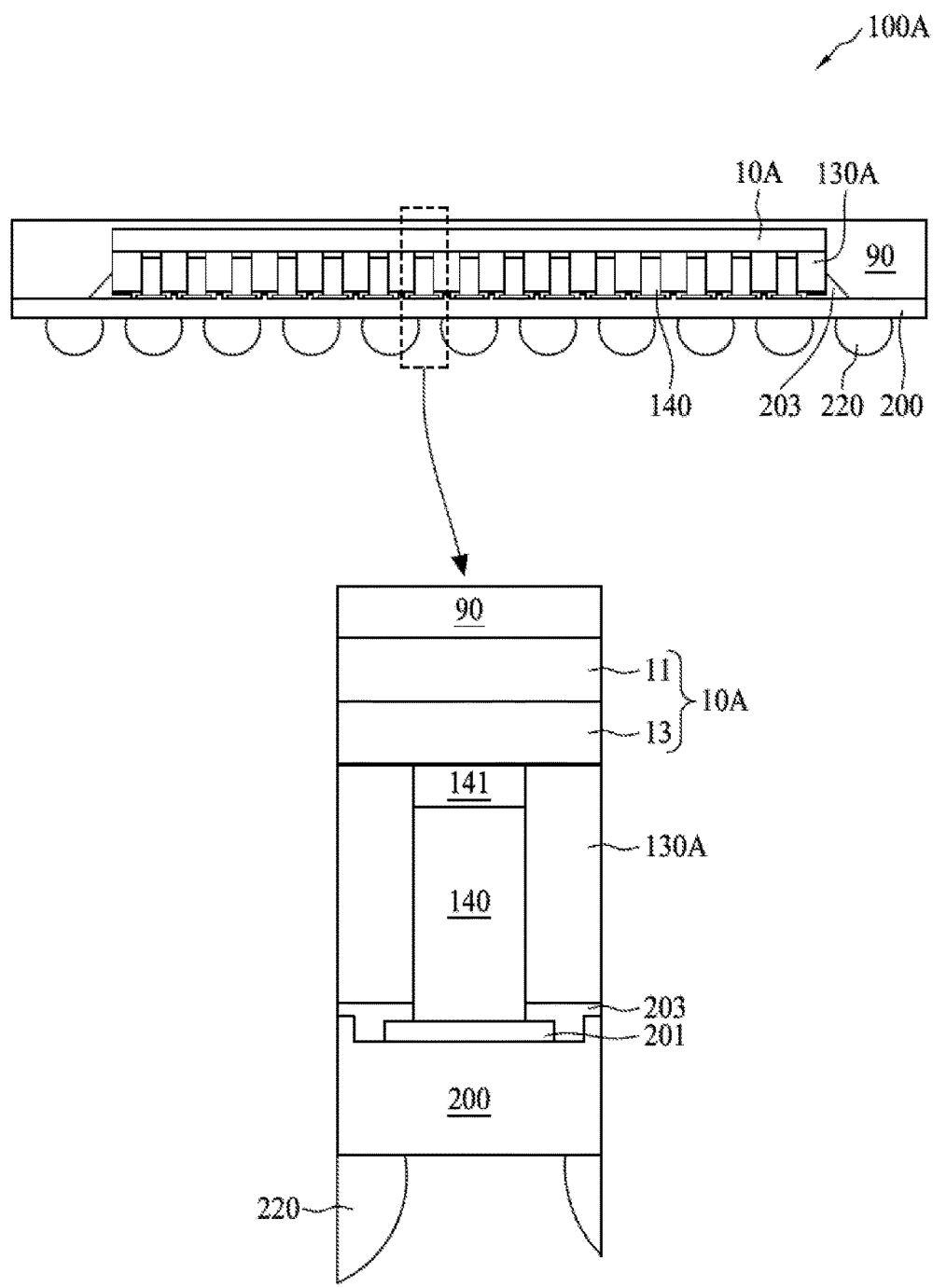
FIG. 1 is a cross-sectional view of a semiconductor package in accordance with some embodiments of the present disclosure.

FIG. 1 is a cross-sectional view of a semiconductor package 100A in accordance with some embodiments of the present disclosure. In some embodiments, the semiconductor package 100A comprises a integrated circuit die 10A having a plurality of conductive terminals 141, a frame 130A positioned on the integrated circuit die 10A, and a plurality of conductive bumps 140 positioned in the frame 130A, wherein the frame 130A substantially exposes the plurality of conductive terminals 141, and the plurality of conductive bumps 140 electrically connects the plurality of conductive terminals 141. In some embodiments, the semiconductor package 100A further comprises an object 200 having a plurality of conductive pads 201, an adhesive layer 203 interposed between the integrated circuit die 10A and the object 200, and a molding compound 90 encapsulating the integrated circuit die 10A.

In some embodiments, the integrated circuit die 10A is an integrated circuit wafer including a plurality of integrated circuit dies. In some embodiments, the integrated circuit die 10A is one of a plurality of integrated circuit dies on a wafer. In some embodiments, the integrated circuit die 10A is an integrated circuit die separated from a wafer. In some embodiments, the integrated circuit die 10A is a memory chip, such as a DRAM chip or flash memory chip. It is well known that a memory chip comprises address input terminals for addressing memory cells, data input/output terminals for inputting/outputting data to/from the memory cells, and power supply terminals.

In some embodiments, the integrated circuit die 10A includes a substrate portion 11 and an electrical interconnect portion 13 disposed on the substrate portion 11. In some embodiments, the substrate portion 11 may include a silicon wafer. For example, the substrate portion 11 may include a single crystalline silicon wafer, a silicon bulk wafer including a silicon carbide (SiC) layer or silicon germanium (SiGe) layer, or a silicon-on-insulator (SOI) wafer including an insulating layer. In the present embodiments, it is assumed that the substrate portion 11 is a single crystalline silicon bulk wafer. In some embodiments, the at least one integrated circuit die 10A may include unit devices, which may be formed in the substrate portion 11 and/or on the substrate portion 11, and the unit device(s) may include metal-oxide-semiconductor (MOS) transistors.

In some embodiments, the integrated circuit die 10A may further include a first electrical interconnect portion (now shown in the drawings) disposed between the substrate portion 11 and the molding compound 90, and the electrical interconnect portion 13 serves as a second electrical interconnect portion. In some embodiments, the substrate portion 11 may optionally include a through silicon via (now shown in the drawings) electrically connecting the first electrical interconnect portion to the second electrical interconnect portion.

In some embodiments, the frame 130A is a supporting layer of non-conductive material selected from the group consisting of silicon and silicon oxide. In some embodiments, the frame 130A defines the boundary of the conductive bump 140, which has a substantially non-spherical sidewall in a cross-sectional view. In some embodiments, the plurality of conductive bumps 140 have a substantially vertical sidewall in a cross-sectional view. In some embodiments, the object 200 is a package circuit substrate, silicon/glass interposer, or another integrated circuit die; wherein the plurality of conductive bumps 140 are attached respectively to the plurality of conductive pads 201. In some embodiments, the adhesive layer 300 is an anisotropic conductive film (ACF), an anisotropic conductive adhesive (ACA), nonconductive film/paste (NCF/NCP), underfill, MUF (molding underfill), and so on. The ACF or the ACA comprises an insulation film or an insulating adhesive, and conductive particles dispersed within the insulation film or the insulating adhesive. The NCF/NCP or underfill/MUF comprises an insulation film or adhesive, and non-conductive particles dispersed within the insulation film/adhesive.

In some embodiments of the present disclosure, the conductive bumps 140 are surrounded by the frame 130A of silicon or silicon oxide; in contrast; the conventional bumps are surrounded by resin. Because the thermal conductivity of the frame 130A of silicon or silicon oxide is higher than that of resin, the frame 130A has a high thermal dissipation property. In addition, both the strength and stiffness of the frame 130A of silicon or silicon oxide is higher than that of resin, the integrated circuit die 10A with the frame 130A as a whole has a high stress (resulting in the conductive bumps 140 suffering from a lower thermal stress) and the warpage of the integrated circuit die 10A can be reduced.

In the prior art, the molding compound and the adhesive layer form an interface at the circuit part of the integrated circuit die, and the die crack may occur at the circuit part of the integrated circuit die. In contrast, the molding compound 90 and the adhesive layer 203 form an interface at the frame 130A without a circuit, which can prevent the die crack from occurring in the integrated circuit die 10A.

Figure 2:
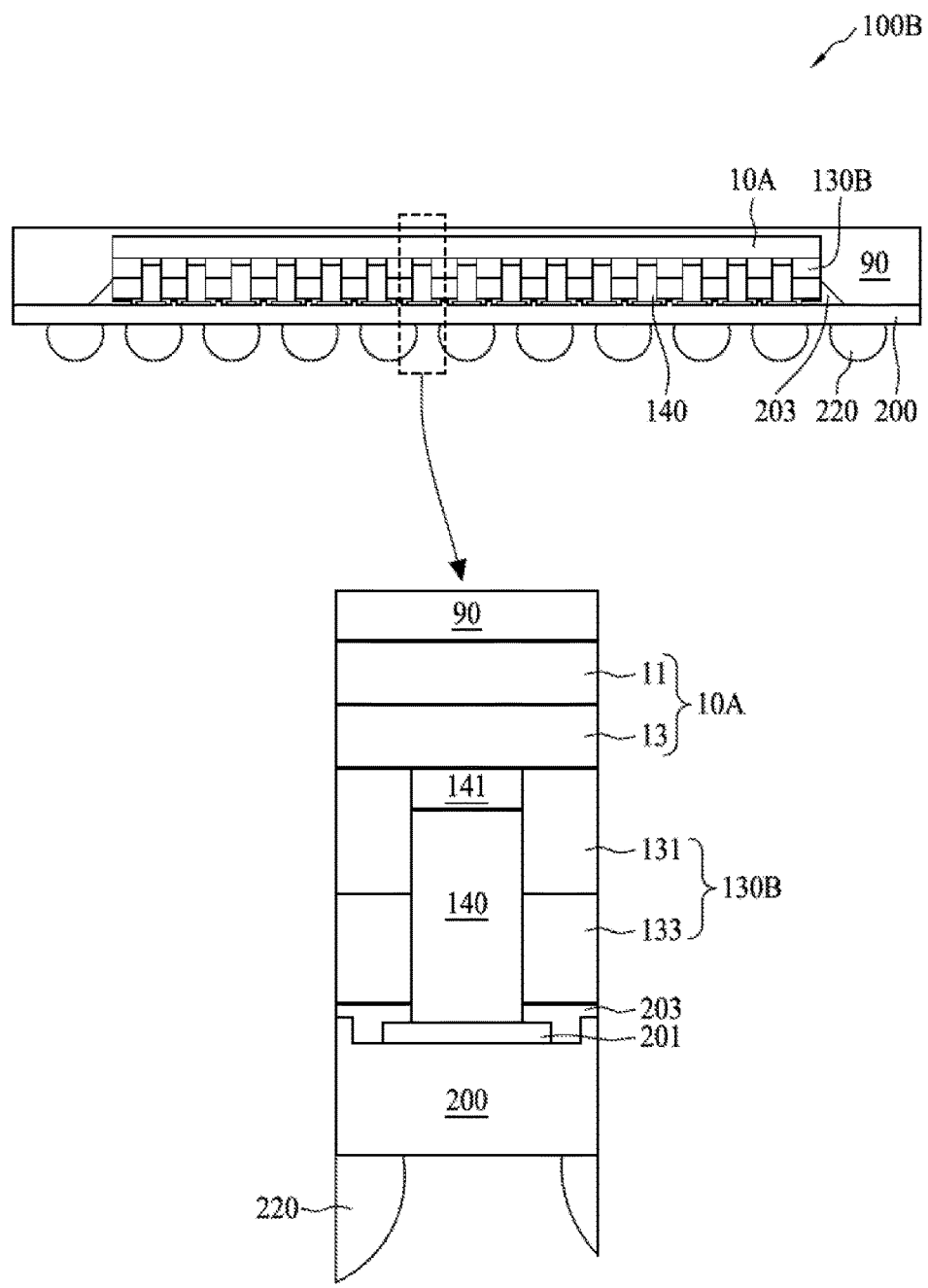
FIG. 2 is a cross-sectional view of a semiconductor package in accordance with some embodiments of the present disclosure.

FIG. 2 is a cross-sectional view of a semiconductor package 100B in accordance with some embodiments of the present disclosure. The semiconductor package 100B in FIG. 2 is similar to the semiconductor package 100A shown in FIG. 1, except that the semiconductor package 100B uses a composite frame 130B. In some embodiments, the composite frame 130B comprises an interposing layer 131 and a supporting layer 133, wherein the interposing layer is disposed between the supporting layer 133 and the integrated circuit die 10A. In some embodiments, the supporting layer 133 is made of non-conductive material selected from the group consisting of silicon and silicon oxide. In some embodiments, the interposing layer 131 is a passivation layer of the integrated circuit die 10A or a glue layer for adhesion improvement between the supporting layer 133 and the integrated circuit die 10A.

Figure 3:
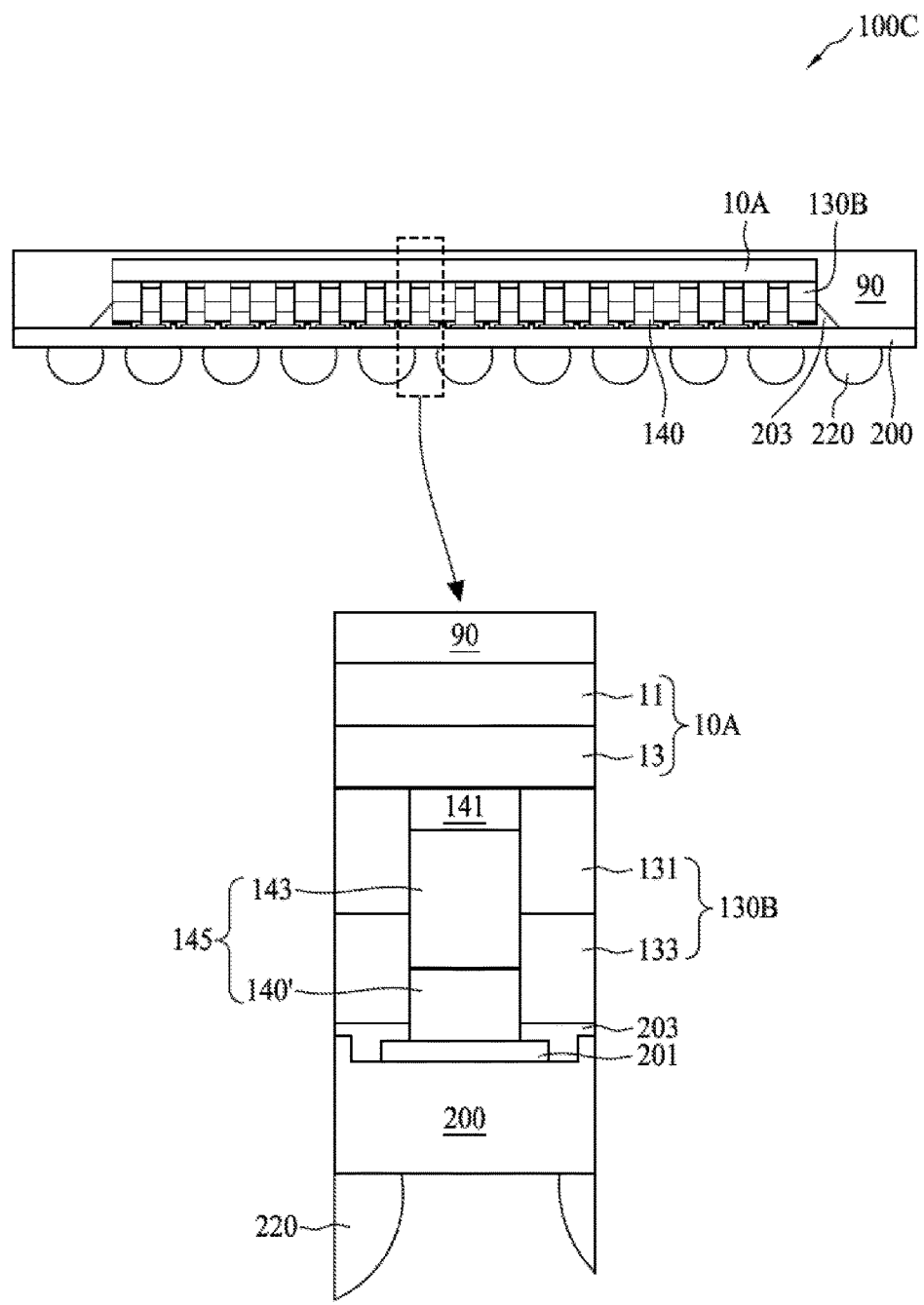
FIG. 3 is a cross-sectional view of a semiconductor package in accordance with some embodiments of the present disclosure.

FIG. 3 is a cross-sectional view of a semiconductor package 100C in accordance with some embodiments of the present disclosure. The semiconductor package 100C in FIG. 3 is similar to the semiconductor package 100B shown in FIG. 2, except that the semiconductor package 100C uses composite plugs 145 to electrically connect the conductive terminals 141 and the conductive pads 201. In some embodiments, each of the composite plugs 145 comprises a conductive joint 143 and a conductive bump 140', wherein the conductive bump 140' is disposed between the conductive joint 143 and the conductive pad 201. In some embodiments, the conductive joints 143 and the conductive bumps 140' are made of conductive material such as copper and tin. In some embodiments, the plurality of conductive joints 143 and the plurality of conductive bumps 140' are made of different conductive materials, e.g., the conductive joints 143 are made of copper and the conductive bumps 140' are made of tin.

Figure 4:
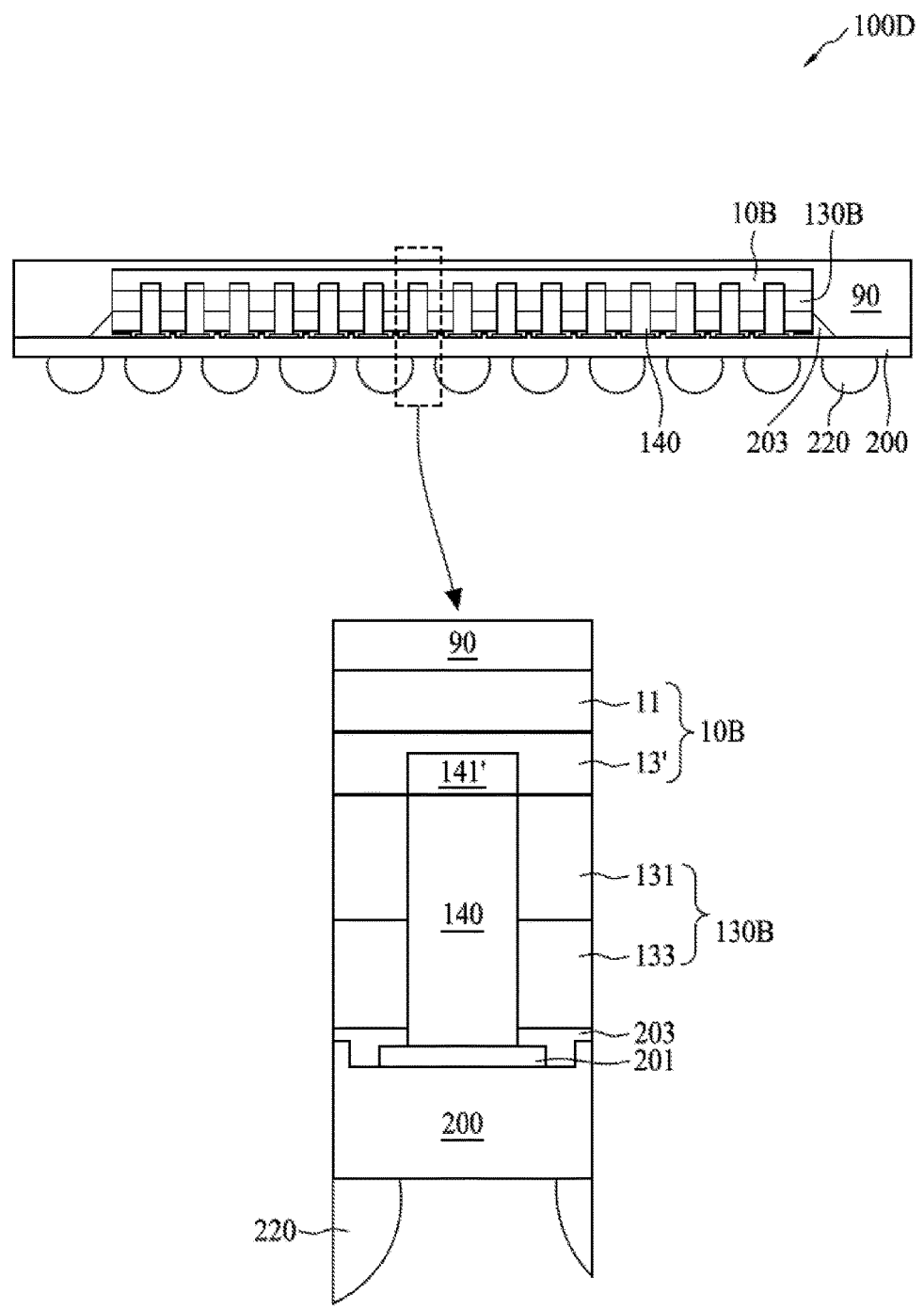
FIG. 4 is a cross-sectional view of a semiconductor package in accordance with some embodiments of the present disclosure.

FIG. 4 is a cross-sectional view of a semiconductor package 100D in accordance with some embodiments of the present disclosure. The semiconductor package 100D in FIG. 4 is similar to the semiconductor package 100B shown in FIG. 2, except that the integrated circuit die 10B of the semiconductor package 100D uses embedded conductive terminals 141'. In some embodiments, the integrated circuit die 10B comprises a substrate portion 11 and an electrical interconnect portion 13' on the substrate portion 11. In FIG. 4, the embedded conductive terminals 141' of the integrated circuit die 10B are disposed in the electrical interconnect portion 13', while the conductive terminals 141 of the integrated circuit die 10A are disposed above the electrical interconnect portion 13 in FIG. 2.

FIGS. 5-10 are cross-sectional views showing the fabrication of a chip package 100B in accordance with some embodiments of the present disclosure.

Figure 5:
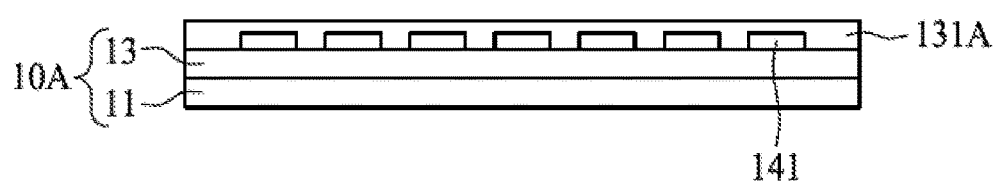
FIGS. 5-10 are cross-sectional views showing the fabrication of a chip package in accordance with some embodiments of the present disclosure.

Referring to FIG. 5, an electrical interconnect portion 13 is formed on a substrate portion 11 by fabrication processes including deposition, lithographic and etching processes. Subsequently, a plurality of conductive terminals 141 are formed on the electrical interconnect portion 13 by fabrication processes including deposition, lithographic and etching processes so as to form an integrated circuit die 10A, and a passivation layer 131A is then formed on the integrated circuit die 10A by a deposition process. In some embodiments, the substrate portion 11 may include a transistor in an active area (AA) surrounded by an isolation structure such as a shallow trench isolation (STI). In some embodiments, the electrical interconnect portion 13 is formed on the substrate portion 11 by back-end-of-line (BEOL) metallization technology.

Figure 6:
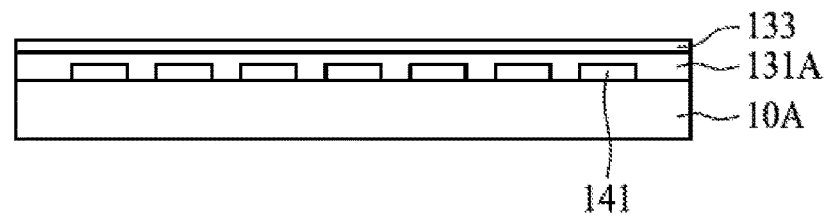

Referring to FIG. 6, a supporting layer 133 is formed on the integrated circuit die 10A, wherein the supporting layer 133 is made of non-conductive material selected from the group consisting of silicon and silicon oxide. In some embodiments, the supporting layer 133 is formed on the integrated circuit die 10A by a fusion bonding process. Details of the fusion bonding process are available in the article (An Overview of Patterned Metal/Dielectric Surface Bonding: Mechanism, Alignment and Characterization, J. Electrochem. Soc. 2011 volume 158, issue 6, P81-P86), the entirety of which is herein incorporated by reference and will not be repeated.

Figure 7:
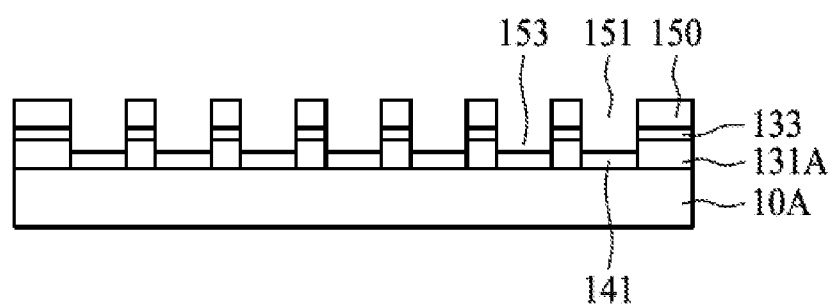

Referring to FIG. 7, an etching mask layer 150, such as a photoresist layer having a plurality of openings 151, is formed on the supporting layer 133 by a lithographic process, wherein the plurality of openings 151 are positioned above the plurality of conductive terminals 141. Subsequently, an etching process, such as the dry etching process, is performed to form a plurality of holes 153 in the supporting layer 133 by using the etching mask layer 150, and the plurality of holes 153 expos the plurality of conductive terminals 141.

Figure 8:
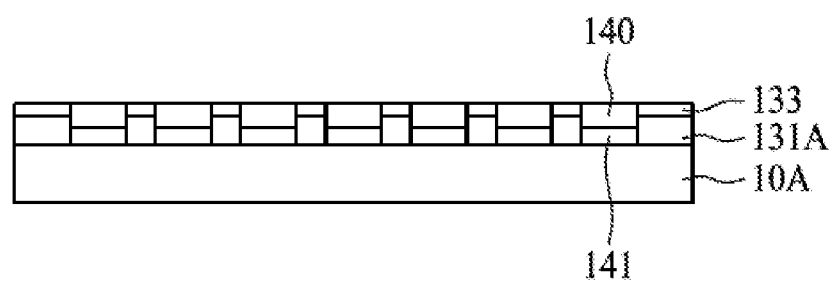

Referring to FIG. 8, the etching mask layer 150 is stripped, and a plurality of conductive bumps 140 are formed in the plurality of holes 153 of the supporting layer 133 by a metal plating process, wherein the plurality of conductive bumps 140 electrically connects the plurality of conductive terminals 141, respectively. In some embodiments, the supporting layer 133 with the holes 153 serves as a frame defining the boundary of the conductive bump 140, which has a substantially non-spherical sidewall in a cross-sectional view because the holes 153 are formed by the dry etching process. In some embodiments, the plurality of conductive bumps 140 have a substantially vertical sidewall in a cross-sectional view because the holes 153 are formed by the dry etching process.

Figure 9:
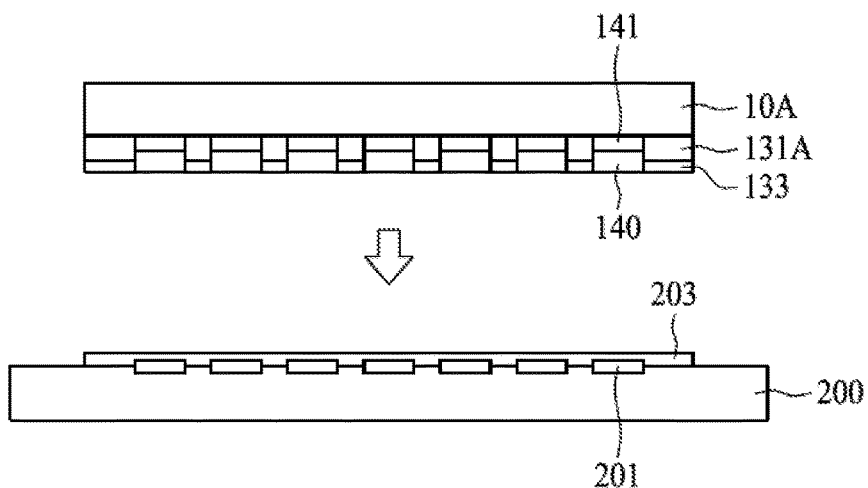
Figure 10:
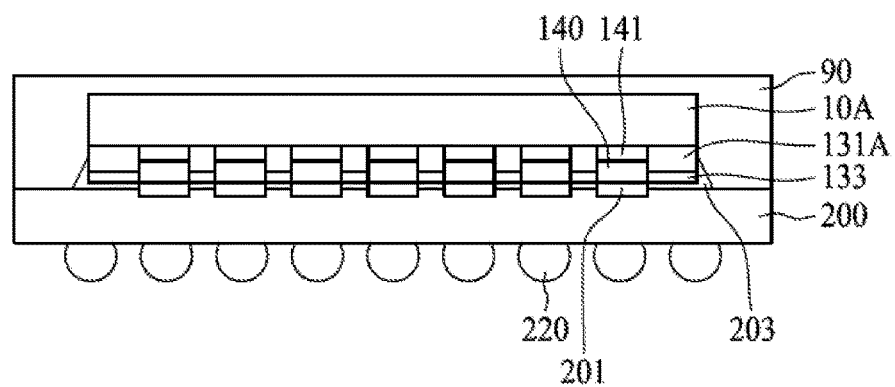

Referring to FIG. 9, the article in FIG. 8 is flipped and attached to an object 200 having a plurality of conductive pads 201, with an adhesive layer 203 interposed between the integrated circuit die 10A and the object 200. Subsequently, a molding compound 90 is formed to encapsulate the integrated circuit die 10A and a plurality of solder balls 220 are formed on the object 200 so as to form a semiconductor package 100B, as shown in FIG. 10.

In some embodiments of the present disclosure, the frame 130B defines the boundary of the conductive bumps 140, i.e., the present disclosure forms the frame 130B before the bumps. In some embodiments, the holes 153 in the frame 130B for the conductive bumps 140 are formed by a lithographic process and an etching process, which can form the holes 153 (the conductive bumps 140) in an extremely fine-pitch, and the conductive bumps 140 can be formed with a very fine size. Consequently, the present disclosure is capable of implementing a semiconductive device having high input/output density.

In some embodiments, the semiconductor package 100A can be fabricated substantially by the processes disclosed in FIGS. 5-10, wherein the passivation layer 131A and the supporting layer 133 shall be made of the same material, such as silicon oxide or silicon.

In some embodiments, the semiconductor package 100D can be fabricated substantially by the processes disclosed in FIGS. 5-10, wherein the conductive terminals 141 are formed in the electrical interconnect portion 13.

FIGS. 11-16 are cross-sectional views showing the fabrication of a chip package 100B in accordance with some embodiments of the present disclosure.

Figure 11:
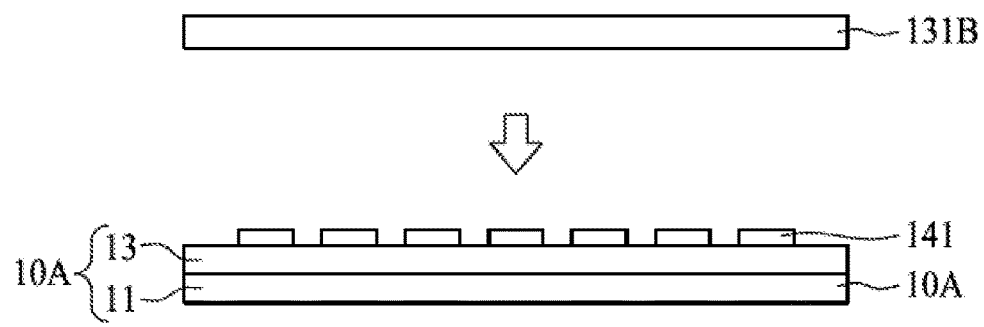
FIGS. 11-16 are cross-sectional views showing the fabrication of a chip package in accordance with some embodiments of the present disclosure.

Referring to FIG. 11, an electrical interconnect portion 13 is formed on a substrate portion 11 by fabrication processes including deposition, lithographic and etching processes. Subsequently, a plurality of conductive terminals 141 are formed on the electrical interconnect portion 13 by fabrication processes including deposition, lithographic and etching processes so as to form an integrated circuit die 10A, and a glue layer 131B is then attached onto the integrated circuit die 10A.

Figure 12:
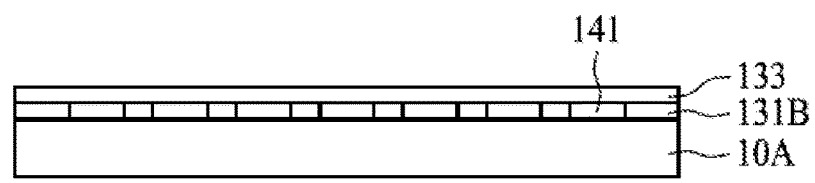

Referring to FIG. 12, a supporting layer 133 is formed on the integrated circuit die 10A, wherein the supporting layer 133 is made of non-conductive material selected from the group consisting of silicon and silicon oxide.

Figure 13:
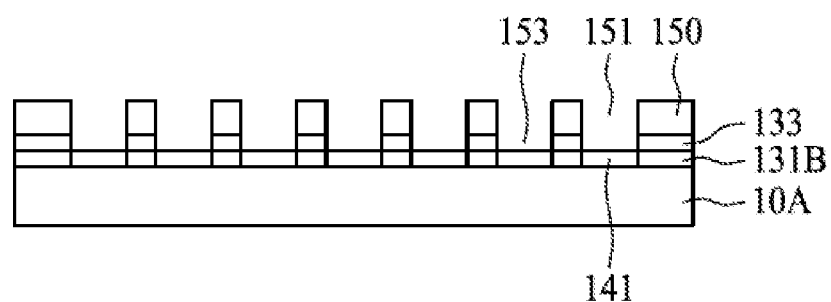

Referring to FIG. 13, an etching mask layer 150, such as a photoresist layer having a plurality of openings 151, is formed on the supporting layer 133 by a lithographic process, wherein the plurality of openings 151 are positioned above the plurality of conductive terminals 141. Subsequently, an etching process, such as the dry etching process, is performed to form a plurality of holes 153 in the supporting layer 133 by using the etching mask layer 150, and the plurality of holes 153 expos the plurality of conductive terminals 141.

Figure 14:
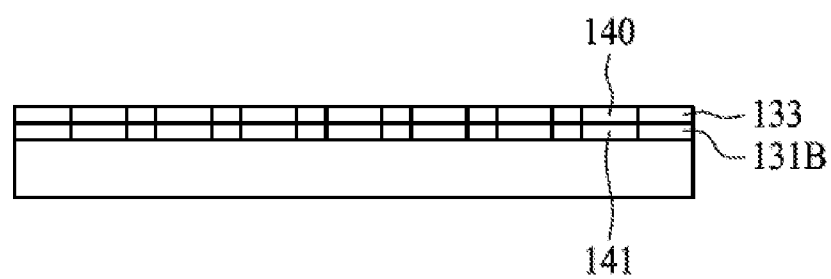

Referring to FIG. 14, the etching mask layer 150 is stripped, and a metal plating process is performed to form a plurality of conductive bumps 140 in the plurality of holes 153 of the supporting layer 133, wherein the plurality of conductive bumps 140 electrically connects the plurality of conductive terminals 141. In some embodiments, the supporting layer 133 serves as a frame defining the boundary of the conductive bump 140, which has a substantially non-spherical sidewall in a cross-sectional view. In some embodiments, the plurality of conductive bumps 140 have a substantially vertical sidewall in a cross-sectional view.

Figure 15:
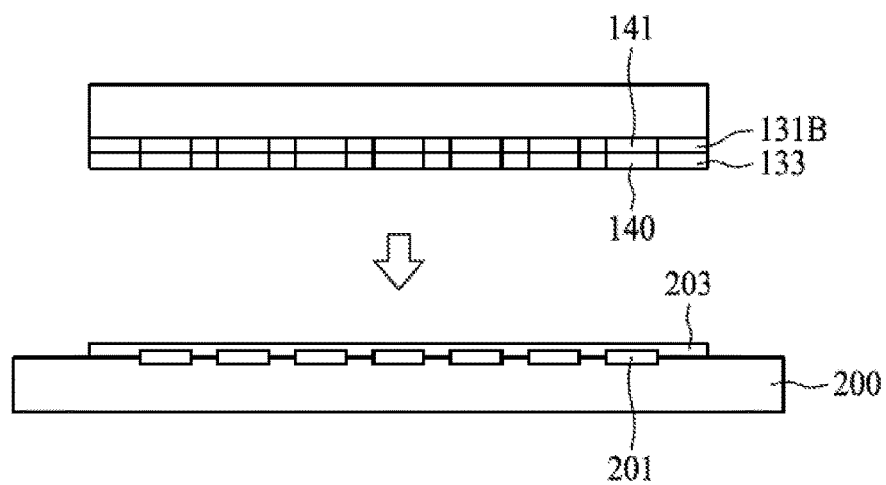
Figure 16:
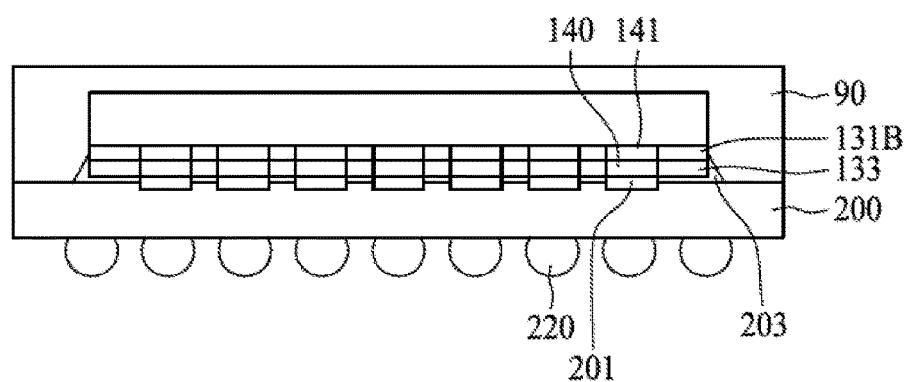

Referring to FIG. 15, the article in FIG. 14 is flipped and attached to an object 200 having a plurality of conductive pads 201, with an adhesive layer 203 interposed between the integrated circuit die 10A and the object 200. Subsequently, a molding compound 90 is formed to encapsulate the integrated circuit die 10A and a plurality of solder balls 220 are formed on the object 200 so as to form a semiconductor package 100B, as shown in FIG. 16.

FIGS. 17-22 are cross-sectional views showing the fabrication of a chip package 100B in accordance with some embodiments of the present disclosure.

Figure 17:
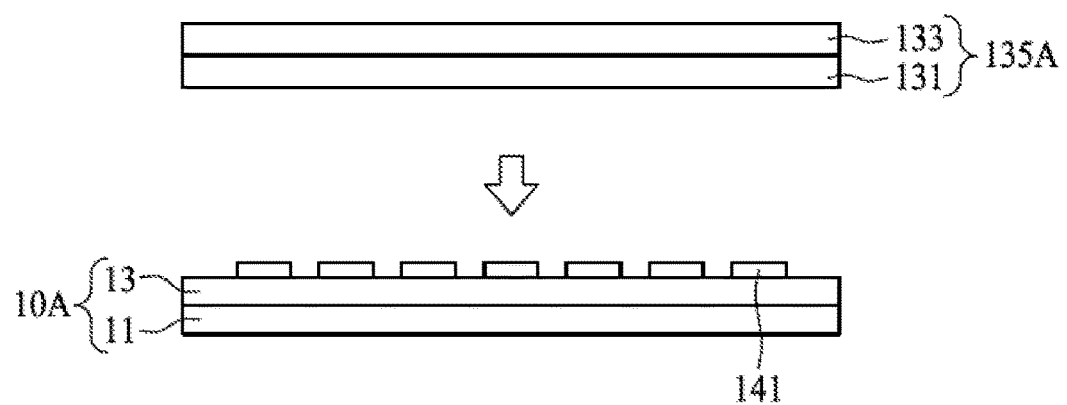
FIGS. 17-22 are cross-sectional views showing the fabrication of a chip package in accordance with some embodiments of the present disclosure.
Figure 18:
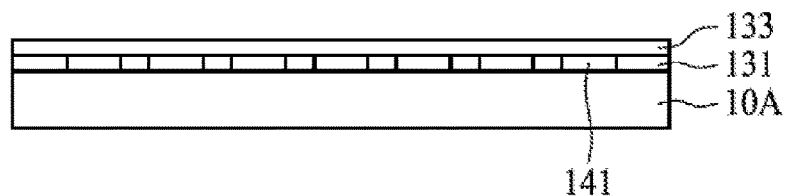

Referring to FIG. 17, an electrical interconnect portion 13 is formed on a substrate portion 11 by fabrication processes including deposition, lithographic and etching processes. Subsequently, a plurality of conductive terminals 141 are formed on the electrical interconnect portion 13 by fabrication processes, including deposition, lithographic and etching processes, so as to form an integrated circuit die 10A. Next, a composite laminate 135A is then attached onto the integrated circuit die 10A, as shown in FIG. 18. In some embodiments, the composite laminate 135B comprises a glue layer 131, a supporting layer 133 disposed on the glue layer 131, and a plurality of conductive joints 143 disposed between the glue layer 131 and the supporting layer 133.

Figure 19:
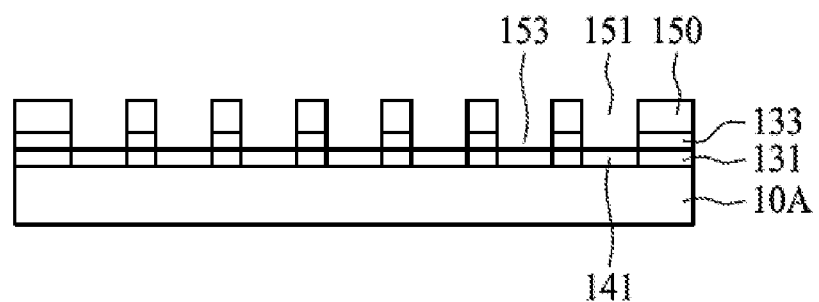

Referring to FIG. 19, an etching mask layer 150, such as a photoresist layer having a plurality of openings 151, is formed on the supporting layer 133 by a lithographic process, wherein the plurality of openings 151 are positioned above the plurality of conductive terminals 141. Subsequently, an etching process, such as the dry etching process, is performed to form a plurality of holes 153 in the supporting layer 133 by using the etching mask layer 150, and the plurality of holes 153 expos the plurality of conductive terminals 141.

Figure 20:
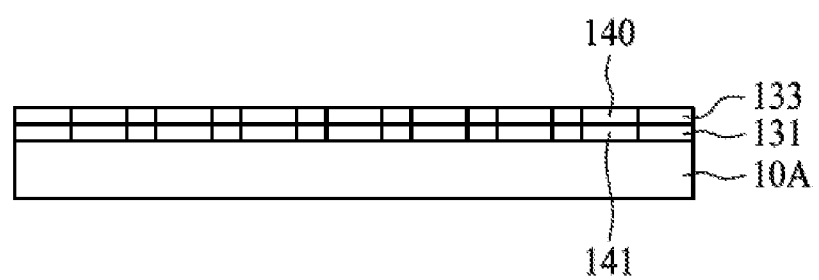

Referring to FIG. 20, the etching mask layer 150 is stripped, and a metal plating process is performed to form a plurality of conductive bumps 140 in the plurality of holes 153 of the supporting layer 133, wherein the plurality of conductive bumps 140 electrically connects the plurality of conductive terminals 141. In some embodiments, the supporting layer 133 serves as a frame defining the boundary of the conductive bump 140, which has a substantially non-spherical sidewall in a cross-sectional view. In some embodiments, the plurality of conductive bumps 140 have a substantially vertical sidewall in a cross-sectional view.

Figure 21:
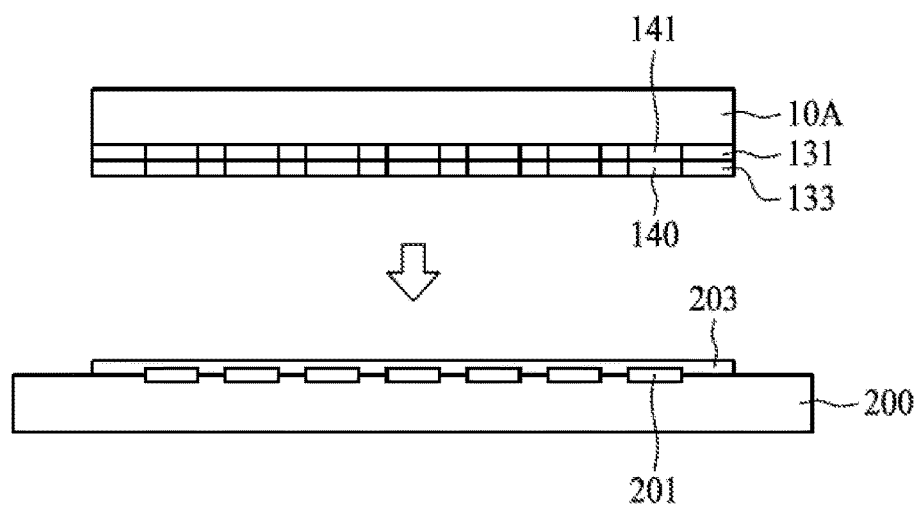
Figure 22:
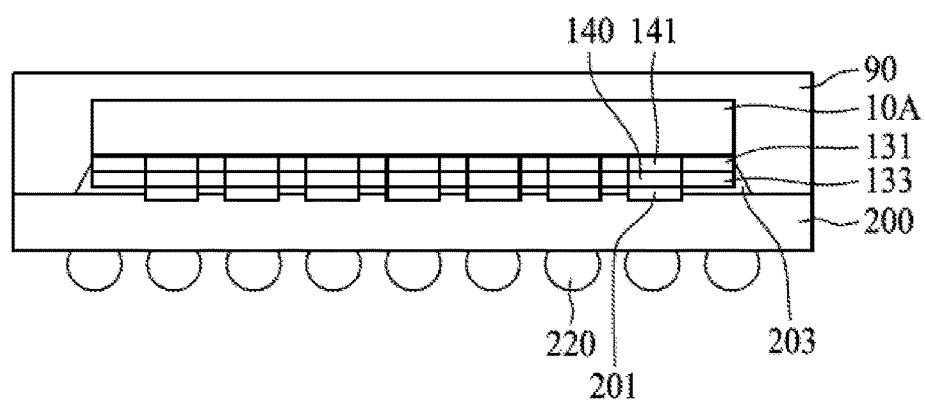

Referring to FIG. 21, the article in FIG. 20 is flipped and attached to an object 200 having a plurality of conductive pads 201, with an adhesive layer 203 interposed between the integrated circuit die 10A and the object 200. Subsequently, a molding compound 90 is formed to encapsulate the integrated circuit die 10A and a plurality of solder ball 220 are formed on the object 200 so as to form a semiconductor package 100B, as shown in FIG. 22.

FIGS. 23-28 are cross-sectional views showing the fabrication of a chip package 100C in accordance with some embodiments of the present disclosure.

Figure 23:
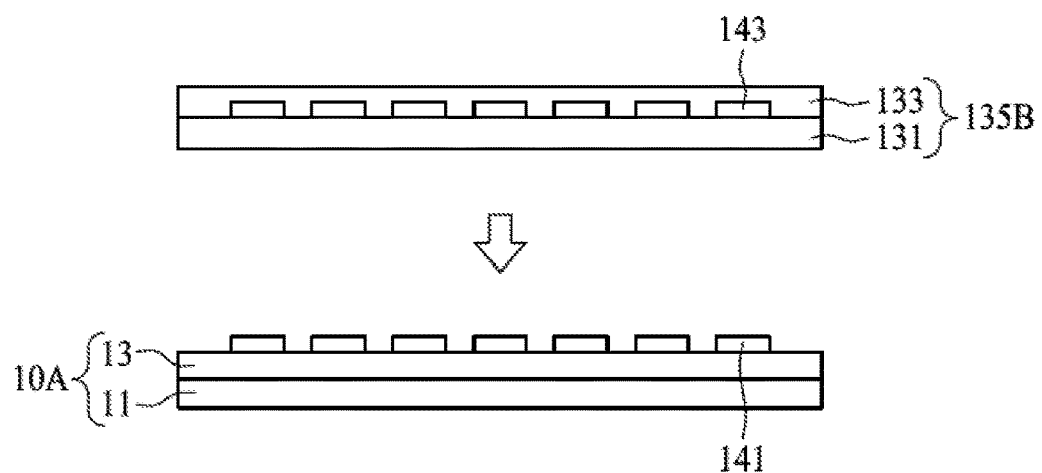
FIGS. 23-28 are cross-sectional views showing the fabrication of a chip package in accordance with some embodiments of the present disclosure.
Figure 24:
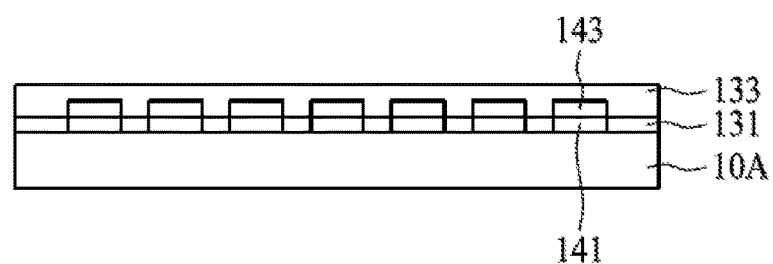

Referring to FIG. 23, an electrical interconnect portion 13 is formed on a substrate portion 11 by fabrication processes including deposition, lithographic and etching processes. Subsequently, a plurality of conductive terminals 141 are formed on the electrical interconnect portion 13 by fabrication processes, including deposition, lithographic and etching processes, so as to form an integrated circuit die 10A. Next, a composite laminate 135B is then attached onto the integrated circuit die 10A, as shown in FIG. 24. In some embodiments, the composite laminate 135B comprises a glue layer 131, a supporting layer 133 disposed on the glue layer 131, and a plurality of conductive joints 143 in the supporting layer 133. In some embodiments, the conductive joints 143 may be optionally formed in the glue layer 131.

Figure 25:
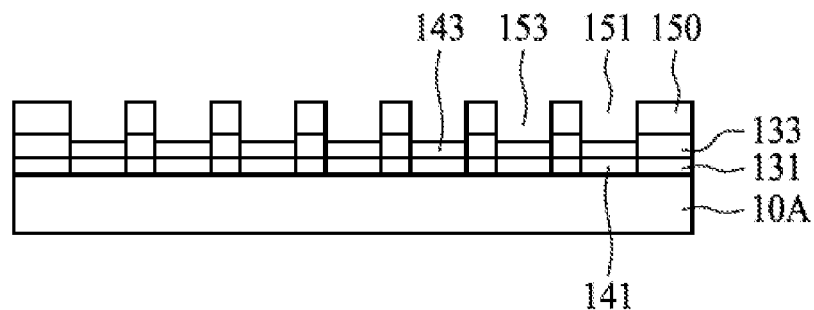
Figure 26:
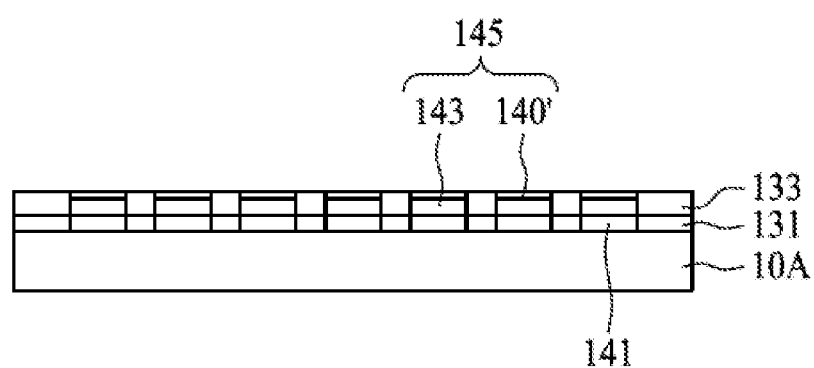

Referring to FIG. 25, an etching mask layer 150, such as a photoresist layer having a plurality of openings 151, is formed on the supporting layer 133 by a lithographic process, wherein the plurality of openings 151 are positioned above the plurality of conductive terminals 141. Subsequently, an etching process, such as the dry etching process, is performed to form a plurality of holes 153 in the supporting layer 133 by using the etching mask layer 150, and the plurality of holes 153 expos the plurality of conductive terminals 141. Referring to FIG. 26, the etching mask layer 150 is stripped, and a metal plating process is performed to form a plurality of conductive bumps 140' in the plurality of holes 153 of the supporting layer 133, wherein the plurality of conductive bumps 140' electrically connect the plurality of conductive terminals 141 via the plurality of conductive joints 143. In some embodiments, the supporting layer 133 serves as a frame defining the boundary of the composite plug 145, which has a substantially non-spherical sidewall in a cross-sectional view. In some embodiments, the composite plug 145 has a substantially vertical sidewall in a cross-sectional view.

Figure 27:
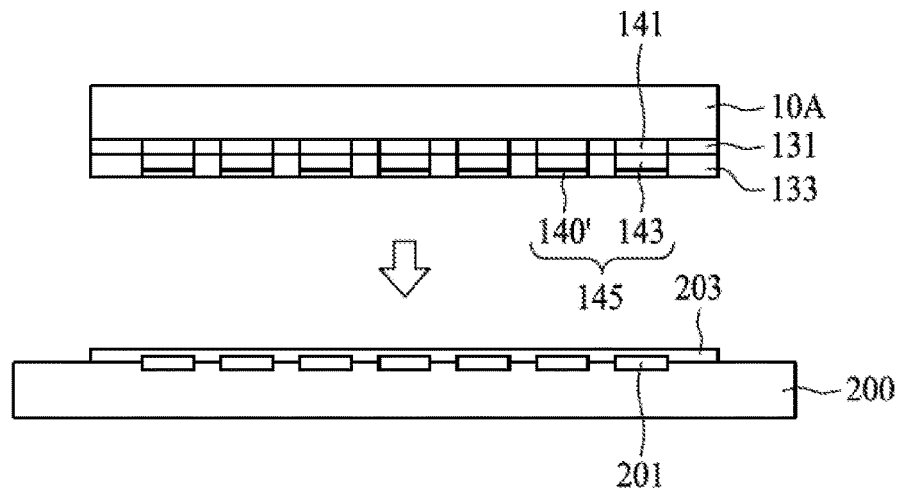
Figure 28:
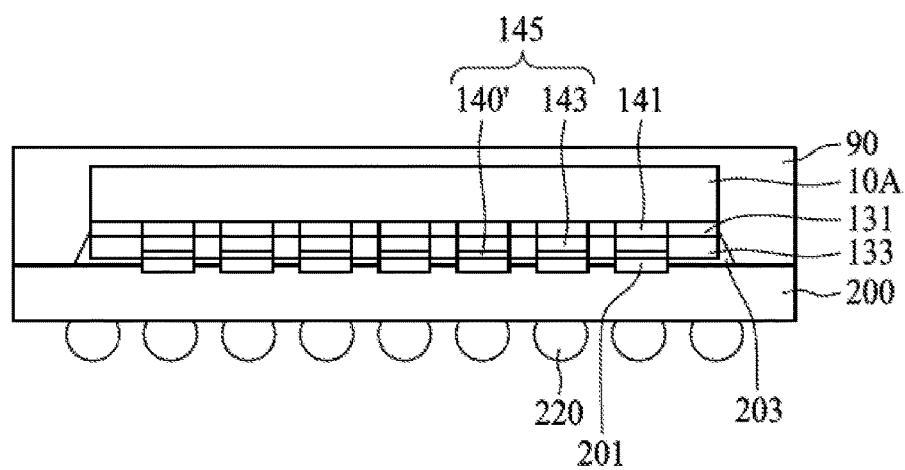

Referring to FIG. 27, the article in FIG. 26 is flipped and attached to an object 200 having a plurality of conductive pads 201, with an adhesive layer 203 interposed between the integrated circuit die 10A and the object 200. Subsequently, a molding compound 90 is formed to encapsulate the integrated circuit die 10A and a plurality of solder balls 220 are formed on the object 200 so as to form a semiconductor package 100C, as shown in FIG. 28.

One aspect of the present disclosure provides a semiconductor device. In some embodiments, the semiconductor device includes an integrated circuit die; at least one conductive terminal disposed on the integrated circuit die; a frame positioned on the integrated circuit die, wherein the frame substantially exposes the at least one conductive terminal; and at least one conductive bump positioned in the frame, wherein the at least one conductive bump electrically connects the at least one conductive terminal.

Another aspect of the present disclosure provides a semiconductor package. In some embodiments, the semiconductor package includes a semiconductor device having at least one conductive terminal; a frame positioned on the semiconductor device, wherein the frame substantially exposes the at least one conductive terminal; at least one conductive bump positioned in the frame, wherein the at least one conductive bump electrically connects the at least one conductive terminal; an object having at least one conductive pad; and an adhesive layer interposed between the semiconductor device and the object.

Another aspect of the present disclosure provides a method for manufacturing a semiconductor package. In some embodiments, the method for manufacturing a semiconductor package comprises the steps of preparing a semiconductor device having at least one conductive terminal; forming a frame on the semiconductor device, wherein the frame substantially exposes the at least one conductive terminal; and forming at least one conductive bump in the frame, wherein the at least one conductive bump electrically connects the at least one conductive terminal.

Another aspect of the present disclosure provides a method for manufacturing a semiconductor package. In some embodiments, the method for manufacturing a semiconductor package comprises the steps of preparing a semiconductor device having at least one conductive terminal; forming a frame having at least one hole and conductive joint on the semiconductor device, wherein the at least one hole and conductive joint are positioned above the at least one conductive terminal; and forming at least one conductive bump in the at least one hole of the frame, wherein the at least one conductive bump electrically connects the at least one conductive terminal.

In some embodiments of the present disclosure, the frame defines the boundary of the conductive bump, i.e., the present disclosure forms the frame before the bump. In some embodiments, the at least one hole in the frame for the conductive bump is formed by the lithographic process and the etching process, which can form the at least one hole (the conductive bump) in an extremely fine-pitch, and the conductive bump can be formed with a very fine size. Consequently, the present disclosure is capable of implementing a semiconductive device having high input/output density.

In some embodiments of the present disclosure, the conductive bump is surrounded by the frame of silicon or silicon oxide; in contrast; the conventional bump is surrounded by resin. Because the thermal conductivity of the frame of silicon or silicon oxide is higher than that of resin, the frame has a high thermal dissipation property. In addition, both the strength and stiffness of the frame of silicon or silicon oxide is higher than that of resin, the semiconductor device with the frame as a whole has a high stress (resulting in the conductive bump suffering from a lower thermal stress) and the warpage of the semiconductor device can be reduced.

In the prior art, the molding compound and the adhesive layer form an interface at the circuit part of the semiconductor device, and the die crack may occur at the circuit part of the semiconductor device. In contrast, the molding compound and the adhesive layer form an interface at the frame without a circuit, which can prevent die crack from occurring in the semiconductor device.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   an integrated circuit die;
   at least one conductive terminal disposed on the integrated circuit die;
   a frame positioned on the integrated circuit die, wherein the frame substantially exposes the at least one conductive terminal; and
   at least one conductive bump positioned in the frame, wherein the at least one conductive bump electrically connects the at least one conductive terminal,
   wherein the frame comprises a supporting layer of non-conductive material selected from the group consisting of silicon and silicon oxide.

2. The semiconductor device of claim 1, wherein the frame further comprises:
   an interposing layer between the supporting layer and the integrated circuit die.

3. The semiconductor device of claim 1, further comprising at least one conductive joint disposed between the at least one conductive bump and the at least one conductive terminal, and the at least one conductive joint and the at least one conductive bump forms at least one conductive plug.

4. The semiconductor device of claim 3, wherein the at least one conductive joint and the at least one conductive bump are made of different materials.

5. The semiconductor device of claim 1, wherein the at least one conductive bump has a substantially non-spherical sidewall in a cross-sectional view.

6. The semiconductor device of claim 1, wherein the at least one conductive bump has a substantially vertical sidewall in a cross-sectional view.

7. A semiconductor package, comprising:
   a semiconductor device having at least one conductive terminal;
   a frame positioned on the semiconductor device, wherein the frame substantially exposes the at least one conductive terminal;
   at least one conductive bump positioned in the frame, wherein the at least one conductive bump electrically connects the at least one conductive terminal;
   an object having at least one conductive pad; and
   an adhesive layer interposed between the semiconductor device and the object,
   wherein the frame comprises a supporting layer of non-conductive material selected from the group consisting of silicon and silicon oxide.

8. The semiconductor package of claim 7, wherein the frame further comprises:
   an interposing layer between the supporting layer and the integrated circuit die.

9. The semiconductor package of claim 7, further comprising at least one conductive joint disposed between the at least one conductive bump and the at least one conductive terminal, and the at least one conductive joint and the at least one conductive bump forms at least one conductive plug.

10. The semiconductor package of claim 9, wherein the at least one conductive joint and the at least one conductive bump are made of different materials.

11. The semiconductor package of claim 7, wherein the at least conductive bump has a substantially non-spherical sidewall in a cross-sectional view.

12. The semiconductor package of claim 7, wherein the at least one conductive bump has a substantially vertical sidewall in a cross-sectional view.

13. A method for manufacturing a semiconductor package, comprising the steps of:
   preparing a semiconductor device having at least one conductive terminal;
   forming a frame on the semiconductor device, wherein the frame substantially exposes the at least one conductive terminal, wherein the frame comprises a supporting layer of non-conductive material selected from the group consisting of silicon and silicon oxide; and forming at least one conductive bump in the frame, wherein the at least one conductive bump electrically connects the at least one conductive terminal.

14. The method for manufacturing a semiconductor package of claim 13, wherein the step of forming a frame on the semiconductor device comprises:

forming the supporting layer on the semiconductor device;

forming an etching mask layer having at least one opening on the supporting layer, wherein the at least one opening is positioned above the at least one conductive terminal; and performing an etching process to form at least one hole in the supporting layer by using the etching mask layer, wherein the at least one hole exposes the at least one conductive terminal.

15. The method for manufacturing a semiconductor package of claim 13, wherein the step of forming a frame on the semiconductor device comprises:

forming an interposing layer on the semiconductor device;

forming the supporting layer on the interposing layer;

forming an etching mask layer having at least one opening on the supporting layer, wherein the at least one opening is positioned above the at least one conductive terminal; and performing an etching process to form at least one hole in the supporting layer by using the etching mask layer, wherein the at least one hole exposes the at least one conductive terminal.

16. The method for manufacturing a semiconductor package of claim 13, wherein the step of forming at least one conductive bump in the frame comprises performing a plating process.

17. The method for manufacturing a semiconductor package of claim 13, further comprising the steps of:

preparing an object having at least one conductive pad; and attaching the semiconductor device to the object with an adhesive layer interposed between the semiconductor device and the object, wherein the plurality of conductive pads electrically connects the at least one conductive bump.

* * * * *